United States Patent
Ha et al.

(10) Patent No.: US 7,368,319 B2
(45) Date of Patent: May 6, 2008

(54) STACKED INTEGRATED CIRCUIT PACKAGE-IN-PACKAGE SYSTEM

(75) Inventors: Jong-Woo Ha, Seoul (KR); Gwang Kim, Ichon-si (KR); JuHyun Park, Seoul (KR)

(73) Assignee: Stats Chippac Ltd., Singapore (SG)

( * ) Notice: Subject to any disclaimer, the term of this patent is extended or adjusted under 35 U.S.C. 154(b) by 252 days.

(21) Appl. No.: 11/276,940

(22) Filed: Mar. 17, 2006

(65) Prior Publication Data

US 2007/0218689 A1    Sep. 20, 2007

(51) Int. Cl.
*H01L 21/00* (2006.01)
*H01L 23/02* (2006.01)
*H01R 12/16* (2006.01)

(52) U.S. Cl. .............. 438/109; 438/125; 438/126; 257/686; 257/687; 257/698; 257/784; 361/790; 361/792

(58) Field of Classification Search ............ None
See application file for complete search history.

(56) References Cited

U.S. PATENT DOCUMENTS

| | | | |
|---|---|---|---|
| 6,605,875 B2 | 8/2003 | Eskildsen | |
| 6,847,104 B2 * | 1/2005 | Huang et al. | 257/685 |
| 6,946,323 B1 | 9/2005 | Heo | |
| 6,972,481 B2 | 12/2005 | Karnezos | |
| 6,998,721 B2 | 2/2006 | Zhou | |
| 7,259,451 B2 * | 8/2007 | Seng et al. | 257/686 |
| 2006/0027841 A1 | 2/2006 | Tamaki | |
| 2007/0018303 A1 * | 1/2007 | Lee | 257/686 |

* cited by examiner

*Primary Examiner*—Alonzo Chambliss
(74) *Attorney, Agent, or Firm*—Mikio Ishimaru

(57) ABSTRACT

A stacked integrated circuit package-in-package system is provided forming a first integrated circuit package having a first encapsulation and a second integrated circuit package having a second encapsulation, stacking the first integrated package below the second integrated circuit package with the first encapsulation attached to the second encapsulation, forming a substrate having an opening from a substrate top surface to a substrate bottom surface, mounting the first integrated circuit package over the substrate top surface, electrically connecting the first integrated circuit package and the substrate bottom surface through the opening, and electrically connecting the second integrated circuit package and the substrate top surface.

20 Claims, 3 Drawing Sheets

STACKED INTEGRATED CIRCUIT PACKAGE-IN-PACKAGE SYSTEM

TECHNICAL FIELD

The present invention relates generally to integrated circuit packages and more particularly to stacked integrated circuit package system.

BACKGROUND ART

Electronics demand more integrated circuits in an integrated circuit package while paradoxically providing less physical space in the system for the increased integrated circuits content. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

Modern electronics, such as smart phones, personal digital assistants, location based services devices, servers, and storage arrays, are packing more integrated circuits into an ever shrinking physical space with expectations for decreasing cost. Numerous technologies have been developed to meet these requirements. Some of the research and development strategies focus on new package technologies while others focus on improving the existing package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

Numerous package approaches stack multiple integrated circuit dice or package in package (PIP) or a combination thereof. The electrical connections to the each of the stacked integrated circuit require space typically formed by spacers, such as silicon or interposers. Current spacers require additional steps and structures increasing manufacturing costs and decreasing manufacturing yields. These spacers also limit the amount of height reduction.

Thus, a need still remains for a stacked integrated circuit package-in-package system providing low cost manufacturing, improved yields, and reduce the integrated circuit package dimensions. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a stacked integrated circuit package-in-package system including forming a first integrated circuit package having a first encapsulation and a second integrated circuit package having a second encapsulation, stacking the first integrated package below the second integrated circuit package with the first encapsulation attached to the second encapsulation, forming a substrate having an opening from a substrate top surface to a substrate bottom surface, mounting the first integrated circuit package over the substrate top surface, electrically connecting the first integrated circuit package and the substrate bottom surface through the opening, and electrically connecting the second integrated circuit package and the substrate top surface Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
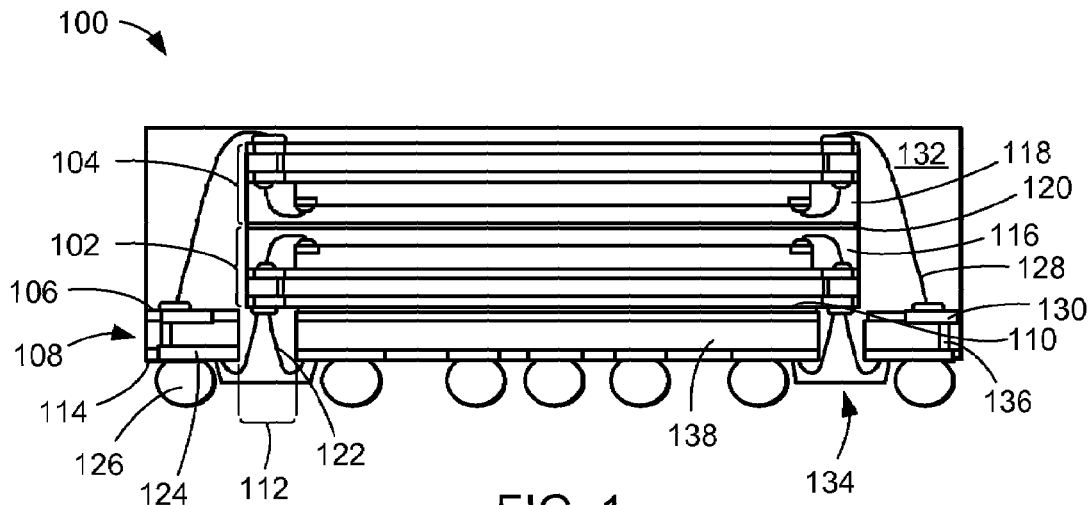
FIG. 1 is a cross-sectional view of a first stacked integrated circuit package-in-package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", "under", are defined with respect to the horizontal plane.

The term "processing" as used herein includes deposition of material, patterning, exposure, development, etching, cleaning, molding, and/or removal of the material or as required in forming a described structure.

Referring now to FIG. 1, therein is shown a cross-sectional view of a first stacked integrated circuit package-in-package system 100 in an embodiment of the present invention. The first stacked integrated circuit package-in-package system 100 packs more integrated circuits while decreasing overall package height and profile by stacking a first integrated circuit package system 102 below a second integrated circuit package system 104 in a back-to-back configuration. The stacked back-to-back configuration includes the first integrated circuit package system 102 attached on a package substrate top surface 106 of a package substrate 108 with a first adhesive 110, wherein the package substrate 108 has openings 112, such as through holes, providing space for electrical connections to a package substrate bottom surface 114 of the package substrate 108.

The back-to-back configuration has a first encapsulation 116 of the first integrated circuit package system 102 attached to a second encapsulation 118 of the second integrated circuit package system 104 using a second adhesive 120. Separate spacers, such as silicon spacers or interposer structures, are not used in this stacking configuration resulting in reduced manufacture steps, improved yield, reduced package height, and reduced cost. Both the first integrated circuit package system 102 and the second integrated circuit package system 104 may be tested before assembly for the first stacked integrated circuit package-in-package system 100 ensuring known good devices (KGD) and increasing yield.

First interconnects 122, such as bond wires or gold wires, connect the first integrated circuit package system 102 and package bottom contacts 124 at the package substrate bottom surface 114 through the openings 112. This connection structure further reduces the height of the first stacked integrated circuit package-in-package system 100 and improves yield by eliminating the first interconnects 122 from the location of the back-to-back stacking structure. External interconnects 126, such as solder balls, also attach on the package bottom contacts 124. The package bottom contacts 124 serve both as input/output (I/O) terminal pads as well as bond pads. Second interconnects 128, such as bond wires or gold wires, connect the second integrated circuit package system 104 and package top contacts 130 at the package substrate top surface 106. The package top contacts 130 also serve both as input/output (I/O) terminal pads as well as bond pads.

A package encapsulation 132, such as an epoxy mold compound, covers the first integrated circuit package system 102, the second integrated circuit package system 104, the first interconnects 122, and the second interconnects 128. The package encapsulation 132 also fills the openings 112 and forms center gate molds 134 protecting the first interconnects 122 on the package substrate bottom surface 114. The center gate molds 134 do not impede the external interconnects 126 to attach to the package bottom contacts 124 or to a next system level (not shown), such as a printed circuit board or another integrated circuit package.

The package bottom contacts 124 and the package top contacts 130 may be part of conductive traces (not shown) in the package substrate 108. Electrical vias 136 connect the package bottom contacts 124, the package top contacts 130, and other conductive traces in a predetermined configuration. An insulation 138, such as a dielectric, isolates the conductive traces from each other and the electrical vias 136 from each other as well as provides structural support for the package substrate 108. For illustrative purpose, the package substrate 108 is shown as a two-layer substrate, although it is understood that the number of layers may be different.

Figure 2:
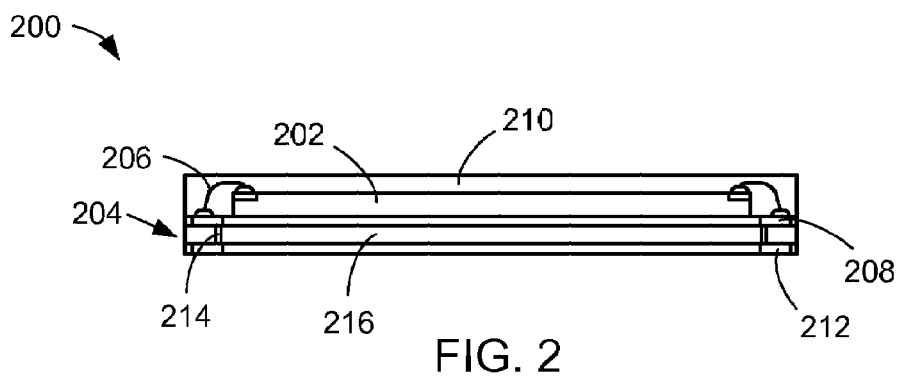
FIG. 2 is a cross-sectional view of an integrated circuit package system in an embodiment of the present invention.

Referring now to FIG. 2, therein is shown a cross-sectional view of an integrated circuit package system 200 in an embodiment of the present invention. The integrated circuit package system 200 may represent a structure for the first integrated circuit package system 102 of FIG. 1 and the second integrated circuit package system 104 of FIG. 1 as well as for other integrated circuit package system in other embodiments. The integrated circuit package system 200 includes an integrated circuit die 202 attached on a substrate 204, such as an organic or inorganic carrier. Interconnects 206, such as bond wires, connect the integrated circuit die 202 to a first metal layer 208 of the substrate 204. An encapsulation 210 covers and protects the integrated circuit die 202 and the interconnects 206.

The substrate 204 also includes a second metal layer 212 for connections of the integrated circuit package system 200 to a next system level, such as the package substrate 108 of FIG. 1, a printed circuit board (not shown), or another integrated circuit package (not shown). Electrical vias 214 connect traces of the first metal layer 208 to the second metal layer 212 in a predetermined configuration. An insulation 216, such as a dielectric, isolates the traces of the first metal layer 208 from each other, the traces of the second metal layer 212 from each other, the electrical vias 214 from each other, and the first metal layer 208 with the second metal layer 212 as well as provides structural support for the substrate 204. The first metal layer 208 and the second metal layer 212 may have contacts, such as terminal pads, bond fingers, peripheral contacts, or inner contacts.

The integrated circuit package system 200 is the package inside the first stacked integrated circuit package-in-package system 100 of FIG. 1. The encapsulation 210 also protects the integrated circuit package system 200 withstanding the stacking process and the encapsulation process forming the first stacked integrated circuit package-in-package system 100.

For illustrative purpose, the integrated circuit die 202 is shown as a bare die, although it is understood that the integrated circuit die 202 may not be bare. Also for illustrative purpose, the substrate 204 is shown as having two layers of metal, although it is understood that the number layers may differ. Further for illustrative purpose, the integrated circuit package system 200 is shown not having stacked integrated circuits, although it is understood that the integrated circuit package system 200 may also have stacked integrated circuits as well as may have package-in-package configuration.

Figure 3:
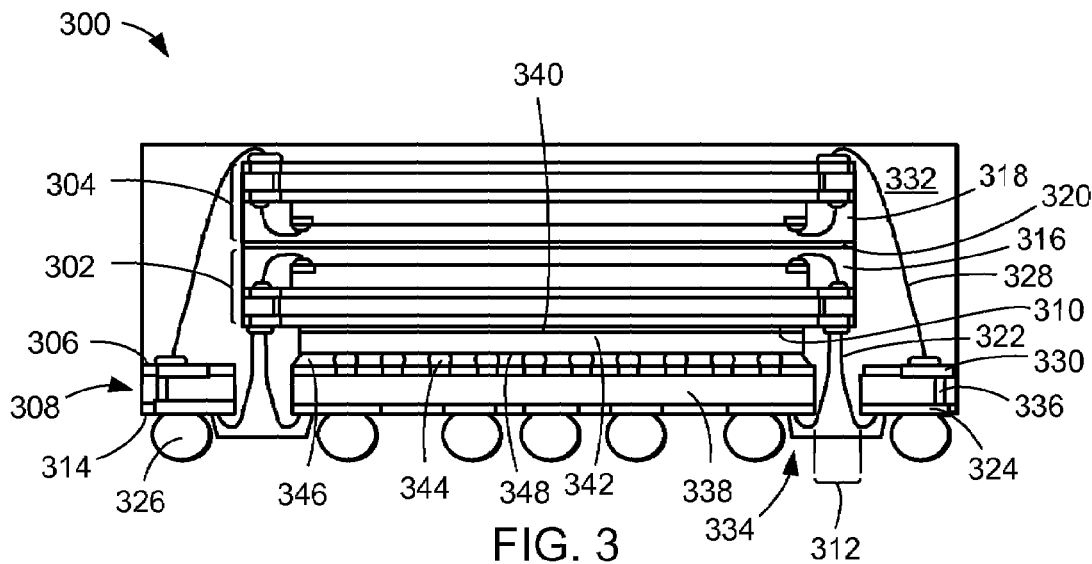
FIG. 3 is a cross-sectional view of a second stacked integrated circuit package-in-package system in an alternative embodiment of the present invention.

Referring now to FIG. 3, therein is shown a cross-sectional view of a second stacked integrated circuit package-in-package system 300 in an alternative embodiment of the present invention. The second stacked integrated circuit package-in-package system 300 also packs more integrated circuits while decreasing overall package height and profile by stacking a first integrated circuit package system 302 below a second integrated circuit package system 304 in a back-to-back configuration.

The first integrated circuit package system 302 attaches on a non-active side 340 of an integrated circuit die 342, such as a flip chip, with a first adhesive 310, such as a die-attach adhesive. The integrated circuit die 342 may be tested before assembly in the second stacked integrated circuit package-in-package system 300 ensuring known good devices (KGD) and increasing yield. The integrated circuit die 342 attaches on a package substrate top surface 306 of a package substrate 308 with die interconnects 344, such as solder bumps. An underfill encapsulation 346 covers an active side 348 of the integrated circuit die 342 and fills the space between the die interconnects 344. The package substrate 308 has openings 312, such as through holes, providing space for electrical connections to a package substrate bottom surface 314 of the package substrate 308.

The back-to-back configuration has a first encapsulation 316 of the first integrated circuit package system 302 attached to a second encapsulation 318 of the second integrated circuit package system 304 using a second adhesive 320. Separate spacers, such as silicon spacers or interposer structures, are not used in this stacking configuration resulting in reduced manufacture steps, improved yield, reduced package height, and reduced cost. Both the first integrated circuit package system 302 and the second integrated circuit package system 304 also may be tested before assembly for the second stacked integrated circuit package-in-package system 300 ensuring known good devices (KGD) and increasing yield.

First interconnects 322, such as bond wires or gold wires, connect the first integrated circuit package system 302 and package bottom contacts 324 at the package substrate bottom surface 314 through the openings 312. This connection structure further reduces the height of the second stacked integrated circuit package-in-package system 300 and improves yield by eliminating the first interconnects 322 from the location of the back-to-back stacking structure. External interconnects 326, such as solder balls, also attach on the package bottom contacts 324. The package bottom contacts 324 serve both as input/output (I/O) terminal pads as well as bond pads. Second interconnects 328, such as bond wires or gold wires, connect the second integrated circuit package system 304 and package top contacts 330 at the package substrate top surface 306. The package top contacts 330 also serve both as input/output (I/O) terminal pads as well as bond pads.

A package encapsulation 332, such as an epoxy mold compound, covers the first integrated circuit package system 302, the second integrated circuit package system 304, the first interconnects 322, and the second interconnects 328. The package encapsulation 332 also fills the openings 312 and forms center gate molds 334 protecting the first interconnects 322 on the package substrate bottom surface 314. The center gate molds 334 do not impede the external interconnects 326 to attach to the package bottom contacts 324 or to a next system level (not shown), such as a printed circuit board or another integrated circuit package.

The package bottom contacts 324 and the package top contacts 330 may be part of conductive traces (not shown) in the package substrate 308. Electrical vias 336 connect the package bottom contacts 324, the package top contacts 330, and other conductive traces in a predetermined configuration. An insulation 338, such as a dielectric, isolates the conductive traces from each other and the electrical vias 336 from each other as well as provides structural support for the package substrate 308. For illustrative purpose, the package substrate 308 is shown as a two-layer substrate, although it is understood that the number of layers may be different.

Figure 4:
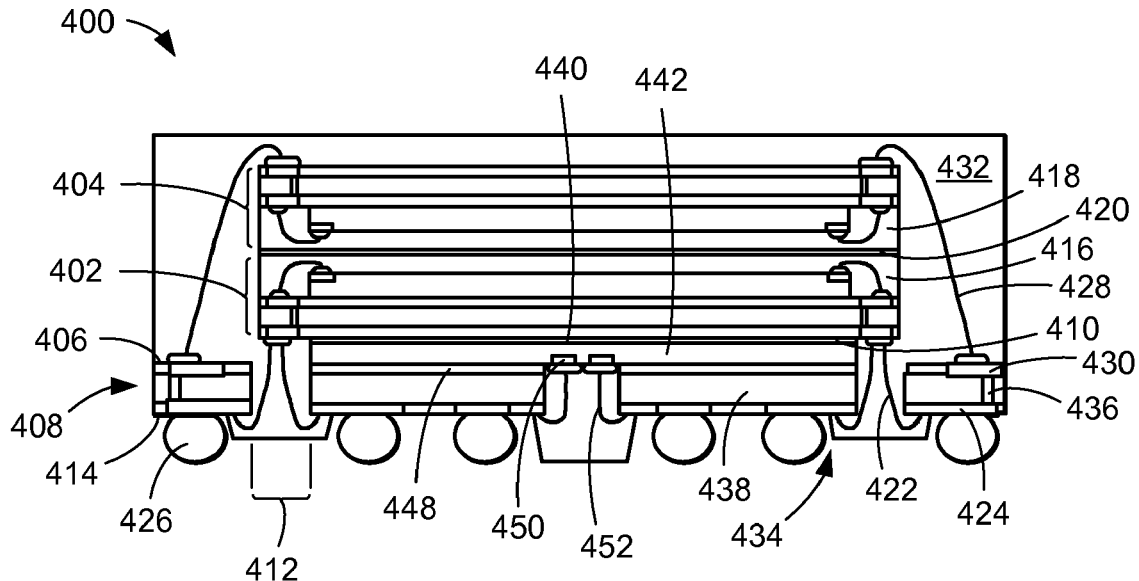
FIG. 4 is a cross-sectional view of a third stacked integrated circuit package-in-package system in another alternative embodiment of the present invention.

Referring now to FIG. 4, therein is shown a cross-sectional view of a third stacked integrated circuit package-in-package system 400 in another alternative embodiment of the present invention. The third stacked integrated circuit package-in-package system 400 also packs more integrated circuits while decreasing overall package height and profile by stacking a first integrated circuit package system 402 below a second integrated circuit package system 404 in a back-to-back configuration.

The first integrated circuit package system 402 attaches on a non-active side 440 of an integrated circuit die 442 with a first adhesive 410, such as a die-attach adhesive. Central bond pads 450 and circuitry (not shown) are on an active side 448 of the integrated circuit die 442, wherein the central bond pads 450 are in a central region of the active side 448.

The integrated circuit die 442 may be tested before assembly in the third stacked integrated circuit package-in-package system 400 ensuring known good devices (KGD) and increasing yield. The integrated circuit die 442 is on a package substrate top surface 406 of a package substrate 408. Central interconnects 452, such as bond wires or gold wires, connect the central bond pads 450 and package bottom contacts 424 at a package substrate bottom surface 414 through openings 412. The package substrate 408 has the openings 412, such as through holes, providing space for electrical connections to the package substrate bottom surface 414 of the package substrate 408.

The back-to-back configuration has a first encapsulation 416 of the first integrated circuit package system 402 attached to a second encapsulation 418 of the second integrated circuit package system 404 using a second adhesive 420. Separate spacers, such as silicon spacers or interposer structures, are not used in this stacking configuration resulting in reduced manufacture steps, improved yield, reduced package height, and reduced cost. Both the first integrated circuit package system 402 and the second integrated circuit package system 404 also may be tested before assembly for the third stacked integrated circuit package-in-package system 400 ensuring known good devices (KGD) and increasing yield.

First interconnects 422, such as bond wires or gold wires, connect the first integrated circuit package system 402 and the package bottom contacts 424 at the package substrate bottom surface 414 through the openings 412. This connection structure further reduces the height of the third stacked integrated circuit package-in-package system 400 and improves yield by eliminating the first interconnects 422 from the location of the back-to-back stacking structure. External interconnects 426, such as solder balls, also attach on the package bottom contacts 424. The package bottom contacts 424 serve both as input/output (I/O) terminal pads as well as bond pads. Second interconnects 428, such as bond wires or gold wires, connect the second integrated circuit package system 404 and package top contacts 430 at the package substrate top surface 406. The package top contacts 430 also serve both as input/output (I/O) terminal pads as well as bond pads.

A package encapsulation 432, such as an epoxy mold compound, covers the first integrated circuit package system 402, the second integrated circuit package system 404, the first interconnects 422, the second interconnects 428, and the central interconnects 452. The package encapsulation 432 also fills the openings 412 and forms center gate molds 434 protecting the first interconnects 422 and the central interconnects 452 on the package substrate bottom surface 414. The center gate molds 434 do not impede the external interconnects 426 to attach to the package bottom contacts 424 or to a next system level (not shown), such as a printed circuit board or another integrated circuit package.

The package bottom contacts 424 and the package top contacts 430 may be part of conductive traces (not shown) in the package substrate 408. Electrical vias 436 connect the package bottom contacts 424, the package top contacts 430, and other conductive traces in a predetermined configuration. An insulation 438, such as a dielectric, isolates the conductive traces from each other and the electrical vias 436 from each other as well as provides structural support for the package substrate 408. For illustrative purpose, the package substrate 408 is shown as a two-layer substrate, although it is understood that the number of layers may be different.

Figure 5:
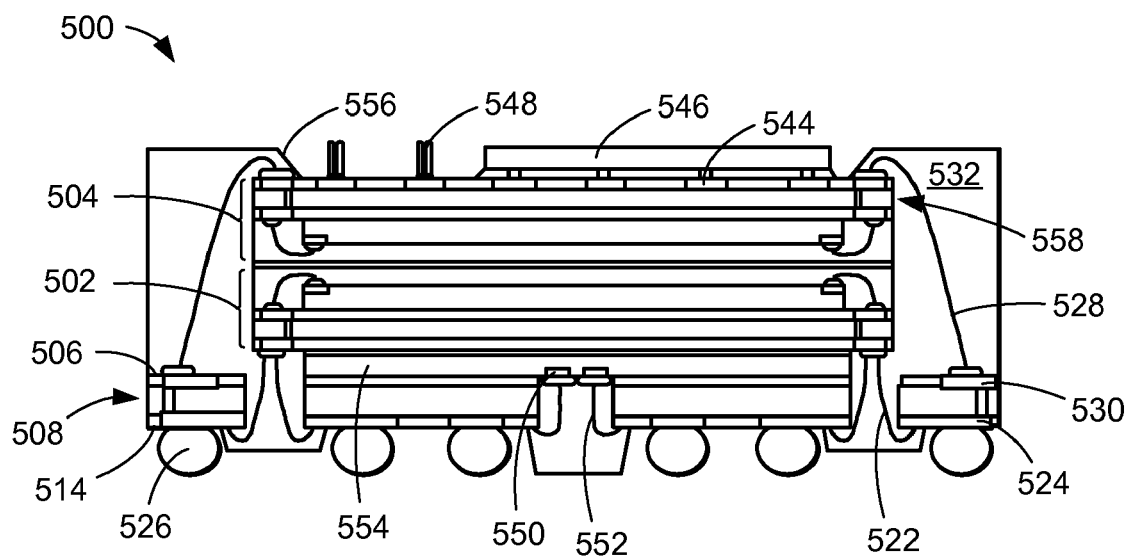
FIG. 5 is a cross-sectional view of a fourth stacked integrated circuit package-in-package system in yet another alternative embodiment of the present invention.

Referring now to FIG. 5, therein is shown a cross-sectional view of a fourth stacked integrated circuit packagein-package system 500 in yet another alternative embodiment of the present invention. The fourth stacked integrated circuit package-in-package system 500 is similar in structure to the third stacked integrated circuit package-in-package system 400 of FIG. 4.

The fourth stacked integrated circuit package-in-package system 500 includes a stack configuration with a first integrated circuit package system 502 stacked below a second integrated circuit package system 504 and an integrated circuit die 554 having central bond pads 550 below the first integrated circuit package system 502. The integrated circuit die 554 is on a package substrate top surface 506 of a package substrate 508.

First interconnects 522 connect the first integrated circuit package system 502 to package bottom contacts 524 at a package substrate bottom surface 514. Second interconnects 528 connect the second integrated circuit package system 504 and package top contacts 530 at the package substrate top surface 506. Central interconnects 552 connect the central bond pads of the integrated circuit die 554 and the package bottom contacts 524. External interconnects 526 also connect to the package bottom contacts 524.

A package encapsulation 532 has a recess 556 at a top of the package encapsulation 532 exposing a non-peripheral portion of a second package substrate 558 of the second integrated circuit package system 504, wherein the package encapsulation 532 covers the second interconnects 528 on the second package substrate 558. The recess 556 exposes second package contacts 544 of the second package substrate 558 allowing other devices to mount onto the fourth stacked integrated circuit package-in-package system 500 forming a package-on-package configuration. A flip chip 546 and small pre-packaged components 548, such as passive discrete devices, mount on the second package substrate 558 in the recess 556.

Figure 6:
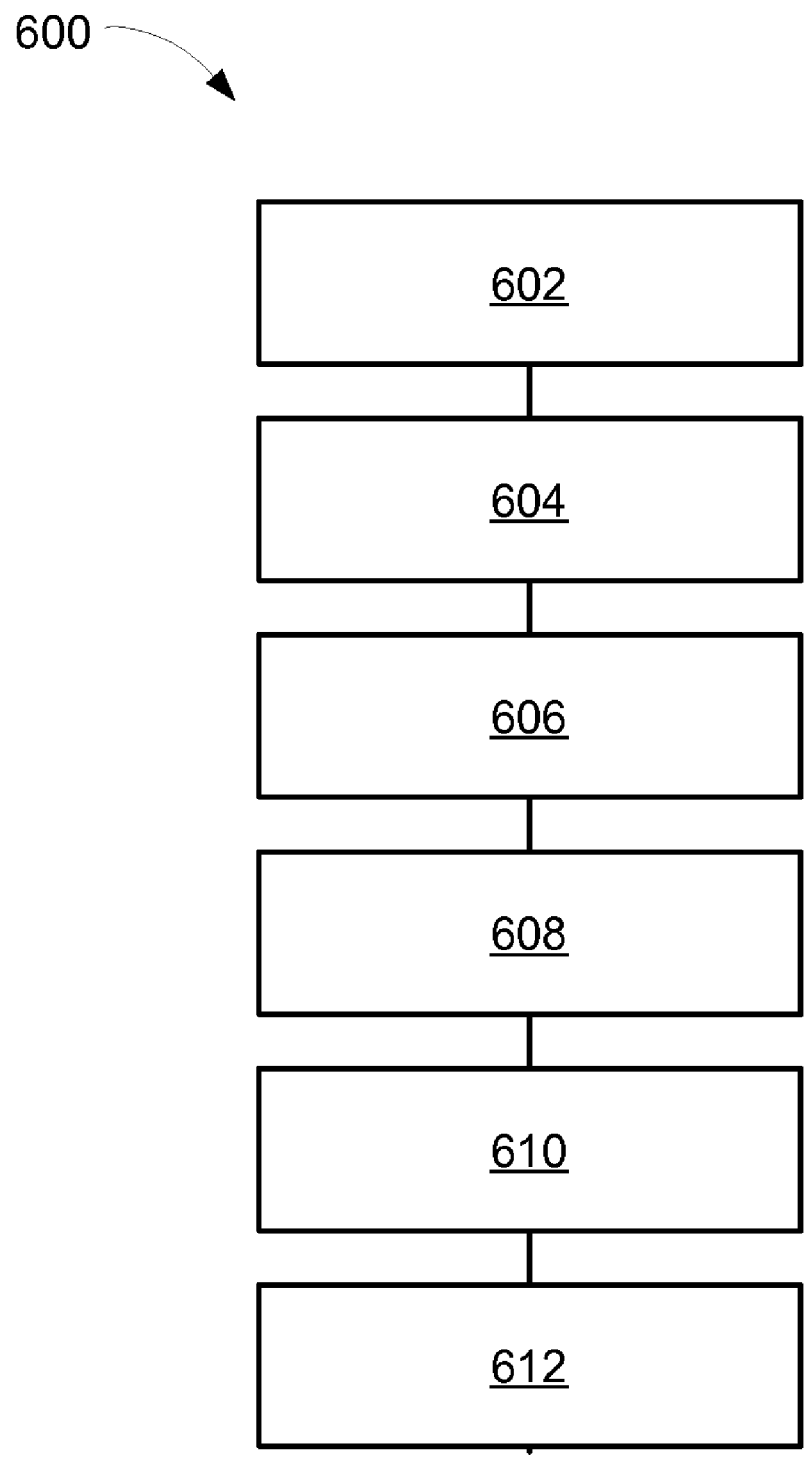
FIG. 6 is a flow chart of a stacked integrated circuit package-in-package system for manufacture of the stacked integrated circuit package-in-package system in an embodiment of the present invention.

Referring now to FIG. 6, therein is shown a flow chart of a stacked integrated circuit package-in-package system 600 for manufacture of the stacked integrated circuit package-in-package system 100 in an embodiment of the present invention. The system 600 includes forming a first integrated circuit package having a first encapsulation and a second integrated circuit package having a second encapsulation in a block 602; stacking the first integrated package below the second integrated circuit package with the first encapsulation attached to the second encapsulation in a block 604; forming a substrate having an opening from a substrate top surface to a substrate bottom surface in a block 606; mounting the first integrated circuit package over the substrate top surface in a block 608; electrically connecting the first integrated circuit package and the substrate bottom surface through the opening in a block 610; and electrically connecting the second integrated circuit package and the substrate top surface in a block 612.

It has been discovered that the present invention thus has numerous aspects.

It has been discovered that the present invention provides reduced package height with the back-to-back configuration with the pre-packaged integrated circuit devices. The contact sites of the package substrate provide dual functions as bond pads for bond wire connects as well as input/output terminal pads for the solder balls. Openings in the package substrate and the dual functions of the contact sites enable connections from the pre-packaged integrated circuit device to the solder balls reduces the complexity of the electrical path improving the electrical performance.

An aspect is that the present invention provides the back-to-back configuration of pre-packaged devices providing a lower overall package height. Separate spacers are not required for the stacked back-to-back configuration.

Another aspect of the present invention provides the openings in the package substrate to improve electrical performance and further reduce the overall package height. Connections of the pre-packaged device to the package substrate through the openings alleviate the need for space between the stacked pre-packaged devices. These bond wires connecting the pre-packaged device to the contacts of the package substrate Yet another aspect of the present invention provides the contact sites on the package substrate serving dual functions as bond pads for bond wires to connect to a pre-packaged device and as IO terminal pads for the solder balls. This connection eliminates the electrical path from the top side of the package substrate, traces along the top side, electrical vias connecting the top side and the bottom side of the package substrate, traces along the bottom side, and ending at the IO terminal pads to the solder ball. The electrical path reduction improves electrical performance.

Thus, it has been discovered that the stacked integrated circuit package-in-package system method of the present invention furnishes important and heretofore unknown and unavailable solutions, capabilities, and functional aspects for improving thermal performance and reliability in systems. The resulting processes and configurations are straightforward, cost-effective, uncomplicated, highly versatile and effective, can be implemented by adapting known technologies, and are thus readily suited for efficiently and economically manufacturing stacked integrated circuit package-in-package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A stacked integrated circuit package-in-package system comprising:

forming a first integrated circuit package having a first encapsulation and a second integrated circuit package having a second encapsulation;

stacking the first integrated circuit package below the second integrated circuit package with the first encapsulation attached to the second encapsulation;

forming a substrate having an opening from a substrate top surface to a substrate bottom surface;

mounting the first integrated circuit package over the substrate top surface;

electrically connecting the first integrated circuit package and the substrate bottom surface through the opening; and electrically connecting the second integrated circuit package and the substrate top surface.

2. The system as claimed in claim 1 wherein:

electrically connecting the first integrated circuit package and the substrate bottom surface comprises:

electrically connecting the first integrated circuit package and a contact on the substrate bottom surface; and further comprising:

attaching an external interconnect on the contact.

3. The system as claimed in claim 1 further comprising:
mounting an integrated circuit die on the substrate top surface; and
electrically connecting the integrated circuit die and the substrate top surface.

4. The system as claimed in claim 1 further comprising:
mounting an integrated circuit die on the substrate top surface; and
electrically connecting the integrated circuit die and the substrate bottom surface through the opening.

5. The system as claimed in claim 1 further comprising:
forming a package encapsulation having a recess, the recess exposes a portion of a second package substrate of the second integrated circuit package; and
mounting a device on the second package substrate in the recess.

6. A stacked integrated circuit package-in-package system comprising:
forming a first integrated circuit package having a first encapsulation and a first substrate;
forming a second integrated circuit package having a second encapsulation and a second substrate;
stacking the first integrated circuit package below the second integrated circuit package with the first encapsulation attached to the second encapsulation with a first adhesive;
forming a package substrate having an opening from a substrate top surface to a substrate bottom surface, the substrate bottom surface has a bottom contact;
mounting the first integrated circuit package over the substrate top surface with the first substrate towards the substrate top surface;
electrically connecting the first integrated circuit package and the bottom contact of the substrate bottom surface through the opening; and
electrically connecting the second integrated circuit package and the substrate top surface.

7. The system as claimed in claim 6 further comprising electrically connecting the second substrate and the substrate top surface.

8. The system as claimed in claim 6 wherein:
electrically connecting the first integrated circuit package and the substrate bottom surface comprises:
electrically connecting the first integrated circuit package and the bottom contact on the substrate bottom surface through the opening; and
further comprising:
encapsulating the opening to form a center gate mold on the substrate bottom surface; and
attaching an external interconnect on the contact.

9. The system as claimed in claim 6 further comprising:
mounting an integrated circuit die having a central bond pad on the substrate top surface;
electrically connecting the central bond pad and the substrate bottom surface through the opening;
encapsulating the opening to form a center gate mold on the substrate bottom surface; and
attaching an external interconnect on the contact.

10. The system as claimed in claim 6 further comprising:
forming a package encapsulation having a recess, the recess exposes a portion of the second substrate; and
electrically connecting a device and a terminal pad on the second substrate in the recess.

11. A stacked integrated circuit package-in-package system comprising:
a first integrated circuit package having a first encapsulation and a second integrated circuit package having a second encapsulation;
the first integrated circuit package below the second integrated circuit package with the first encapsulation attached to the second encapsulation;
a substrate having an opening from a substrate top surface to a substrate bottom surface;
the first integrated circuit package over the substrate top surface;
a first interconnect between the first integrated circuit package and the substrate bottom surface through the opening; and
a second interconnect between the second integrated circuit package and the substrate top surface.

12. The system as claimed in claim 11 wherein:
the first interconnect between the first integrated circuit package and the substrate bottom surface comprises:
the first interconnect between the first integrated circuit package and a contact on the substrate bottom surface; and
further comprising:
an external interconnect on the contact.

13. The system as claimed in claim 11 further comprising:
an integrated circuit die on the substrate top surface; and
a second interconnect between the integrated circuit die and the substrate top surface.

14. The system as claimed in claim 11 further comprising:
an integrated circuit die on the substrate top surface; and
a second interconnect between the integrated circuit die and the substrate bottom surface through the opening.

15. The system as claimed in claim 11 further comprising:
a package encapsulation having a recess, the recess exposes a portion of a second package substrate of the second integrated circuit package; and
a device on the second package substrate in the recess.

16. The system as claimed in claim 11 wherein:
the first integrated circuit package has the first encapsulation and a first substrate;
the second integrated circuit package has the second encapsulation and a second substrate;
the first integrated circuit package is below the second integrated circuit package with the first encapsulation attached to the second encapsulation with a first adhesive;
the substrate is a package substrate with an opening from the substrate top surface to the substrate bottom surface having a bottom contact;
the first integrated circuit package is over the substrate top surface with the first substrate towards the substrate top surface;
the first interconnect is between the first integrated circuit package and the bottom contact of the substrate bottom surface through the opening; and
the second interconnect is between the second integrated circuit package and a top contact of the substrate top surface.

17. The system as claimed in claim 16 further comprising a second interconnect between the second substrate and the substrate top surface.

18. The system as claimed in claim 16 wherein:
the first interconnect between the first integrated circuit package and the substrate bottom surface comprises:
the first interconnect between the first integrated circuit package and the bottom contact on the substrate bottom surface through the opening; and further comprising:
   a package encapsulation to fill the opening and to form a center gate mold on the substrate bottom surface; and
   an external interconnect on the contact.
19. The system as claimed in claim 16 further comprising:
   an integrated circuit die having a central bond pad on the substrate top surface;
   a second interconect between the central bond pad and the substrate bottom surface through the opening;
   a package encapsulation to fill the opening and to form a center gate mold on the substrate bottom surface; and
   an external interconnect on the contact.
20. The system as claimed in claim 16 further comprising:
   forming a package encapsulation having a recess, the recess exposes a portion of the second substrate; and
   a second interconnect between a device and a terminal pad on the second substrate in the recess.

* * * * *